United States Patent [19]
Waku et al.

[11] 3,956,719
[45] May 11, 1976

[54] VARIABLE BAND PASS FILTER CIRCUIT

[75] Inventors: Toshihiko Waku; Hiroshi Takeuchi, both of Tokyo, Japan

[73] Assignee: Sony Corporation, Tokyo, Japan

[22] Filed: Nov. 13, 1974

[21] Appl. No.: 523,482

[30] Foreign Application Priority Data
Nov. 16, 1973  Japan .................. 48-132488[U]

[52] U.S. Cl. .................. 333/72; 310/8.2; 333/77
[51] Int. Cl.² .................. H03H 9/26; H03H 9/32
[58] Field of Search ............ 333/72, 71, 77; 328/165, 167; 330/174; 310/8.2, 8.3, 9.8

[56] References Cited
UNITED STATES PATENTS

| | | | |
|---|---|---|---|
| 2,218,087 | 10/1940 | Goering | 330/174 X |
| 3,416,104 | 12/1968 | Argoudelis | 333/77 X |
| 3,456,214 | 7/1969 | Bies | 333/72 |
| 3,727,154 | 4/1973 | Dailing et al. | 330/174 X |

*Primary Examiner*—Alfred E. Smith
*Assistant Examiner*—Marvin Nussbaum
*Attorney, Agent, or Firm*—Hill, Gross, Simpson, Van Santen, Steadman, Chiara & Simpson

[57] ABSTRACT

A variable band pass filter circuit utilizing first and second ceramic filters including a pair of passive circuits that can be selectively connected between the ceramic filters and wherein the first passive circuit comprises a first capacitor connected between the output of the first ceramic filter and the input of the second ceramic filter and the second passive circuit includes a second capacitor connectable between the output of the first ceramic filter and the input of the second ceramic filter and an inductor connected between the input of the second ceramic filter and a reference point.

3 Claims, 6 Drawing Figures

VARIABLE BAND PASS FILTER CIRCUIT

BACKGROUND OF THE INVENTION

1. Field of the Invention:

The present invention relates generally to a variable band pass filter circuit, and more particularly is directed to a variable band pass filter circuit suitable for use with an intermediate frequency amplifier circuit of a radio receiver.

2. Description of the Prior Art:

When an AM broadcasting wave is received in an area where the AM broadcasting wave is feeble, there is a possibility that the S/N ratio will deteriorate to an undesirable extent. Accordingly, recently, in the art, in order to improve the S/N ratio, the pass band range of an intermediate frequency amplifier circuit has been made variable or the pass band range thereof has been narrowed in the area where the broadcasting wave is feeble, so as to eliminate jamming waves.

Variable band pass filter circuits whose pass band range can be as desired as well as various intermediate frequency amplifier circuits have been proposed in the art. For example, an LC-type filter circuit which is formed of a coil forming an intermediate frequency transformer. A capacitor is connected in parallel to the coil, and the number of turns of the coil is varied by a switch to vary the pass band of the filter. However, if the prior art filter circuit is formed as a multituning type, a switch for each filter circuit, is required which results in a circuit construction of such a multi-tuning type filter circuit which is complicated and, it is difficult to maintain the desired selectivity.

In another prior art filter circuit in which a number of ceramic filters are used, two capacitors are connected through a switch in series or parallel between adjacent ceramic filters so as to vary the pass band of the filter circuit. Ceramic filters are described in U.S. Patents No. 2,708,244, which issued May 10, 1955, U.S. Pat. No. 2,943,279 which issued June 28, 1960 and U.S. Pat. No. 2,969,512 which issued Jan. 24, 1961. With this prior art filter circuit, its center frequency $f_o$ (for example, 455 k Hz) is deviated or shifted by changing the capacitors. Also ceramic filters are rich in spurious component which does not improve the S/N ratio. In fact, if the constant of the ceramic filters is previously selected to be so as proper to make its resonance frequency somewhat higher than the center frequency $f_o$, the deviation or shift of the center frequency $f_o$ caused by changing the switch can be compensated. However, such ceramic filters are difficult to obtained and used in practice.

In any case, the prior art filter circuit is complicated and its center frequency $f_o$ will be shifted.

At present, there has been proposed no variable band pass filter which is free from the above defects.

SUMMARY OF THE INVENTION

An object of the present invention is to provide a novel variable band pass filter circuit which eliminates the defects of the prior art.

Another object of the invention is to provide a variable band pass filter circuit having first and second passive circuits one of which is selected to vary a pass band of the filter circuit without shifting its center frequency.

A further object of the invention is to provide a variable band pass filter circuit in which a first passive circuit consisting of a capacitor and a second passive circuit consisting of a capacitor and a coil are selectively connected between two ceramic filters to easily vary the pass band of the filter circuit without deviation of its center frequency.

A still further object of the invention is to provide a variable band pass filter circuit in which a resistor is connected in series with a capacitor and a resistor is connected in parallel with a coil and which has a wide pass band with a single peak but which has a narrow pass band with att, single peak when one capacitor is used.

A yet further object of the invention is to provide a novel variable band pass filter circuit suitable for use with an AM or FM radio receiver.

According to the present invention there is provided a variable band pass filter circuit which comprises a pair of ceramic filters connected in cascade, a signal transmission path provided between the pair of ceramic filters, and first and second passive circuits which are selectively connected to the signal transmission path, the first passive circuit consisting of a capacitor which is connectable in series to the signal transmission path, the second passive circuit consisting of a capacitor which is connectable in series to the signal transmission path and a coil which is connectable in parallel to the signal transmission path.

The other objects, features and advantages of the present invention will be apparent from the following description taken in conjunction with the accompanying drawings.

DESCRIPTION OF THE PREFERRED EMBODIMENT

An embodiment of the variable band pass filter circuit according to the present invention will be hereinafter described with reference to the drawings.

Figure 1:
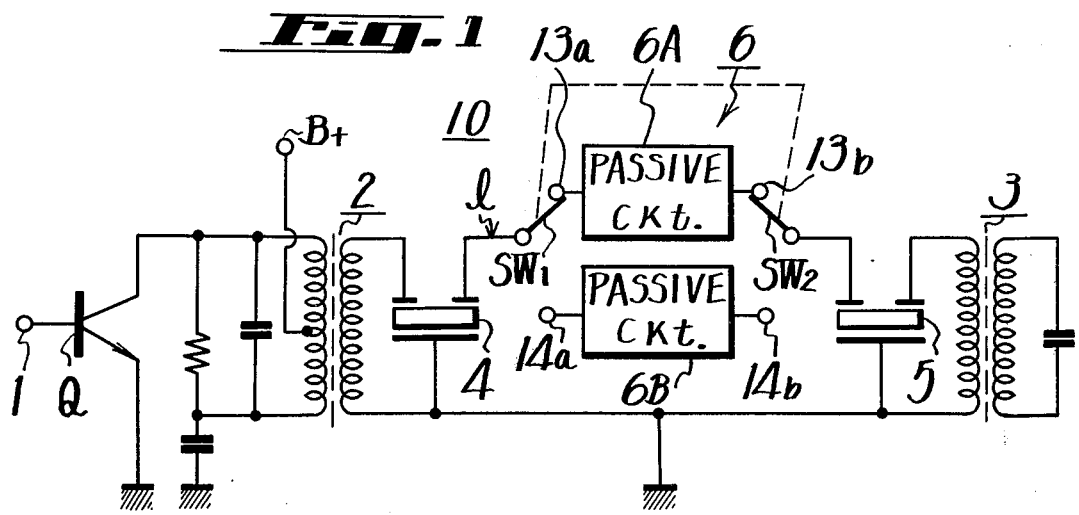
FIG. 1 is a circuit diagram showing an embodiment of the variable band pass filter circuit according to the present invention which is applied to an intermediate frequency amplifier circuit.

In FIG. 1, reference numeral 10 generally designates a variable band pass filter circuit of the invention. A mixed frequency signal is applied to an input terminal 1 which is connected to the base electrode of a transistor Q. Between intermediate frequency transformers 2 and 3, two ceramic filters 4 and 5, each having three terminals, are connected in cascade as resonance elements. In a signal transmission line or path $l$ between the ceramic filters 4 and 5, there is provided a passive circuit 6 for selecting a pass band of the filter circuit 10. As shown in FIG. 1, the passive circuit 6 is formed of first and second passive circuits 6A and 6B one of which is selectively connected to the signal transmission path $l$ by change-over switches $SW_1$ and $SW_2$ ganged together.

When the second passive circuit 6B is inserted into the signal transmission path $l$, the filter circuit 10 has an ordinary pass band $W_2$ (8 to 15 kHz), while when the first passive circuit 6A is inserted into the signal transmission path $l$, the filter circuit 10 has a pass band $W_1$ which is narrow than $W_2$, or, for example, about ⅓ of $W_2$ (about 4 kHz).

Figure 2:
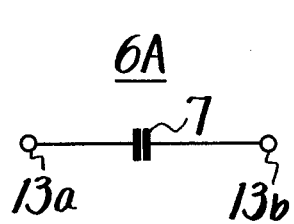
FIG. 2 is a circuit diagram showing a practical embodiment of a first passive circuit used in the embodiment of FIG. 1.

The first passive circuit 6A is formed of a capacitor 7 as shown in FIG. 2. In this case, the capacitor 7 is connected in the signal transmission path $l$ in series thereto when the switches $SW_1$ and $SW_2$ are changed to connect the capacitor 7 or first passive circuit 6A in the signal transmission path $l$.

Figure 3:
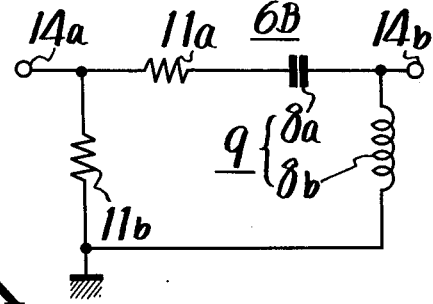
FIG. 3 is a circuit diagram showing a practical embodiment of a second passive circuit used in the embodiment of FIG. 1.
Figure 3A:
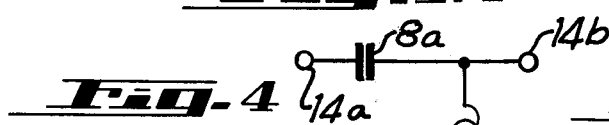
FIG. 3a illustrates the second circuit without resistors.

The second passive circuit 6B is formed of in its simplest form a parallel circuit 9 of a capacitor 8a and a coil 8b as shown in FIG. 3a. However, as shown in FIG. 3 in a practical embodiment, the second passive circuit 6B also includes a pair of resistors 11a and 11b connected as shown which are used for obtaining a frequency characteristic with a single peak as will be described later.

When the second passive circuit 6B is connected in the signal transmission path $l$, the capacitor 8a is connected in series with the signal transmission path $l$ but the coil 8b is connected thereto in parallel to ground.

In FIGS. 1 to 3, reference numerals 13a and 13b represent connecting terminals of the first passive circuit 6A, and 14a and 14b connection terminals of the second passive circuit 6B, respectively.

Figure 4:
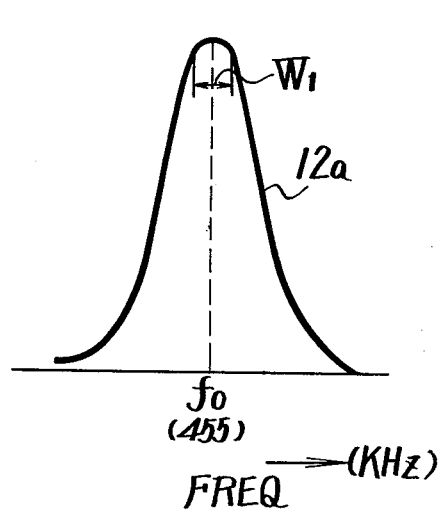
FIGS. 4 and 5 are graphs showing frequency characteristics used for the explanation of the filter circuit according to the invention.
Figure 5:
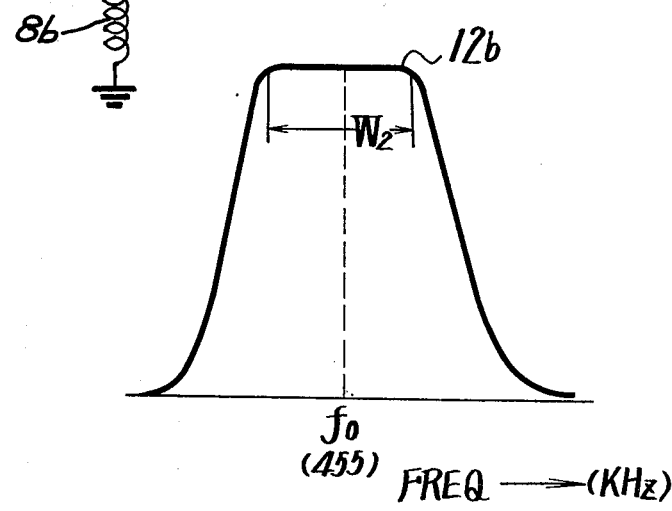

With the variable band pass filter circuit 10 of the present invention, when the first passive circuit 6A is connected to the signal transmission path $l$, the filter circuit 10 is made to have a frequency characteristic such as shown in the graph of FIG. 4 by a curve 12a whose pass band is narrow $W_1$ as compared to $W_2$ of the capacitor 7 is selected to be 15pF in the illustrated embodiment, the pass band $W_1$ can be 4 kHz. On the other hand, when the second passive circuit 6B is connected in the signal transmission path $l$, the filter circuit 10 has a frequency characteristic such as shown in the graph of FIG. 5 by a curve 12b. In this embodiment, the constants of the circuit elements are so selected that its pass band $W_2$ becomes about 15 kHz. By way of example, the capacity of the capacitor 8a is selected to be 200 pF and the inductance of the coil 8b to be 800 μH.

With the present invention, even if the second passive circuit 6B is connected to the signal transmission path $l$ in place of the first passive circuit 6A, the center frequencies of the filter circuit 10 in both cases do not vary from $f_0$. The reason is that the second passive circuit 6B is formed as shown in FIG. 3. That is, as well known in the art, if only a capacitor is connected to the signal transmission path $l$ in series thereto and the capacitance of the capacitor is increased, the pass band $W_1$ can be widened. However, in this case there is a tendency for the center frequency $f_0$ to shift toward the lower side. On the other hand, if a coil is connected in parallel with the signal transmission path $l$ in place of the capacitor and its inductance is increased, the pass band $W_1$ can be widened as in the case of the capacitor. In this case, however, the center frequency $f_0$ may be shifted toward the higher side contrary to the former case.

If, as in the case of the present invention, capacitor 8a is connected in series in the signal transmission path $l$, the coil 8b is connected in parallel to the signal transmission path $l$ and they are increased in capacitance and inductance, respectively, the desired pass band $W_2$ can be obtained. In this case, since the direction of movement of the center frequencies due to the capacitor and coil are in reverse directions to each other, they are cancelled when the desired pass band $W_2$ is obtained. As a result, the center frequency in the case where the second passive circuit 6B is connected in the signal transmission path $l$ becomes equal to $f_0$ as in the case where the first passive circuit 6A is connected in the signal transmission path $l$. That is, the center frequency $f_0$ is not shifted.

If only an LC-circuit is used, the frequency characteristics of the filter circuit 10 has multi-peak characteristics. However, if a pair of resistors 11a and 11b are provided in the second passive circuit 6B as dampers, as shown in FIG. 3, the filter circuit 10 is made to have a single peak characteristic as shown by the curve 12b in the graph of FIG. 5.

As described above, the variable band pass filter circuit 10 of the present invention provides a normal pass band $W_2$ and a pass band $W_1$ narrower than that $W_2$. In the present invention, in order to obtain such different pass bands $W_1$ and $W_2$, the passive circuit 6 consisting of the first and second passive circuits 6A and 6B, shown in FIGS. 2 and 3, respectively, are provided and also the two changeover switches $SW_1$ and $SW_2$, which are ganged with each other, are provided in connection with the passive circuit 6 to select the desired pass band, so that the variable band pass filter circuit 10 of the present invention is very simple in construction.

Further, with the present invention, even in the case where the first and second passive circuits 6A and 6B are changeably connected to the signal transmission line $l$, the second passive circuit 6B, which presents the wider pass band $W_2$ ($W_2 > W_1$), is formed as an LC-parallel circuit as shown in FIG. 3, plus resistors 11a and 11b so that the center frequencies $f_0$ of the respective cases will be equal or the deviation of the center frequency caused by the change of the pass bands can be positively eliminated by a simple circuit construction.

In the present invention, when the first passive circuit 6A is connected to the signal transmission line $l$, the connection stage becomes four, while when the second passive circuit 6B is connected to the signal transmission line $l$, the connection stage becomes five because the coil 8b and the stray capacitor form a further stage. Thus, deterioration of selectivity can be avoided at the same time.

Further, in the present invention, the intermediate transformer 2 is connected to the input stage of the ceramic filter 4 and the intermediate transformer 3 is connected to the output stage of the ceramic filter 5, respectively, so that the spurious signals are greatly reduced and the variation of impedance effects are less and the variable band pass filter 10 has ideal characteristics. Therefore, the variable band pass filter 10 of the present invention is preferred for use with intermediate frequency amplifiers of AM and FM receivers.

The above description is given for only one preferred embodiment of the present invention, but it may be obvious that many variations and modifications could be effected by one skilled in the art without departing from the spirit or scope of the novel concepts of the present invention.

We claim as our invention:

1. A variable band pass filter circuit comprising first and second ceramic filters, an input terminal connected to the input of said first ceramic filter, an output terminal connected to the output of said second ceramic filter, and first and second passive circuits selectively connected between the output of said first ceramic filter and the input of said second ceramic filter, said first passive circuit comprising a first capacitor which when said first passive circuit is connected has one side which receives the output of said first ceramic filter and its other side connected to the input of said second ceramic filter and said second passive circuit comprising a second capacitor which when said second passive circuit is connected has one side which receives the output of said first ceramic filter and its other side connected to the input of said second ceramic filter and an inductor with one side connected to the input of said second ceramic filter and its other side connected to a reference point.

2. A variable band pass filter according to claim 1 wherein said second passive circuit includes a first resistor with one side connected between the output of said first ceramic filter and its other side connected to said reference point.

3. A variable band pass filter according to claim 2 wherein said second passive circuit includes a second resistor between the one side of said first capacitor and the output of said first ceramic filter.

* * * * *